US009824853B2

(12) United States Patent
Kobayashi et al.

(10) Patent No.: US 9,824,853 B2
(45) Date of Patent: Nov. 21, 2017

(54) ELECTRON MICROSCOPE DEVICE AND IMAGING METHOD USING SAME

(71) Applicant: Hitachi High-Technologies Corporation, Minato-ku, Tokyo (JP)

(72) Inventors: Mitsutoshi Kobayashi, Tokyo (JP); Kenji Nakahira, Tokyo (JP); Maki Tanaka, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/312,866

(22) PCT Filed: May 27, 2015

(86) PCT No.: PCT/JP2015/065319
§ 371 (c)(1),
(2) Date: Nov. 21, 2016

(87) PCT Pub. No.: WO2016/002397
PCT Pub. Date: Jan. 7, 2016

(65) Prior Publication Data
US 2017/0169992 A1 Jun. 15, 2017

(30) Foreign Application Priority Data

Jul. 2, 2014 (JP) .................................. 2014-136874

(51) Int. Cl.
*H01J 37/28* (2006.01)
*H01J 37/26* (2006.01)
*H01J 37/244* (2006.01)

(52) U.S. Cl.
CPC .......... *H01J 37/265* (2013.01); *H01J 37/244* (2013.01); *H01J 37/263* (2013.01)

(58) Field of Classification Search
CPC ......... H01J 37/28; H01J 37/222; H01J 37/261
(Continued)

(56) References Cited

U.S. PATENT DOCUMENTS 6,608,305 B1 * 8/2003 Kin ....................... H01J 37/222
250/306
9,390,887 B2 * 7/2016 Plettner ................. H01J 37/244
(Continued)

FOREIGN PATENT DOCUMENTS

JP 2012-32205 A 2/2012
JP 2012-169233 A 9/2012

*Primary Examiner* — David A Vanore
(74) *Attorney, Agent, or Firm* — Miles & Stockbridge P.C.

(57) ABSTRACT

In order to enable high-speed imaging of a wide-field image, the imaging method using the electron microscope comprises: irradiating and scanning a wide-field region of the sample with a low-dose amount of electron beam, and acquiring a wide-field image of the sample; setting, from this wide-field image, a narrow-field region; irradiating and scanning this narrow-field region with a high-dose amount of the electron beam, and acquiring a narrow-field image of the sample; determining the noise-removal parameters for the acquired wide-field image and narrow-field image; performing image quality improvement processing on the wide-field image and the narrow-field image; performing drift correction on the narrow-field image undergone the image quality improvement processing; and combining the narrow-field image undergone this drift correction and the wide-field image in such a manner that the visibility of each is at the same level throughout the entirety of the combined image.

16 Claims, 12 Drawing Sheets

(58) Field of Classification Search
USPC .................................................. 250/307, 310
See application file for complete search history.

(56) References Cited

U.S. PATENT DOCUMENTS

| | | | | |
|---|---|---|---|---|
| 9,633,819 B2* | 4/2017 | Phaneuf | ................ | H01J 37/222 |
| 9,640,366 B2* | 5/2017 | Yokosuka | ................ | H01J 37/28 |
| 2009/0290680 A1* | 11/2009 | Tumer | .................... | G01T 1/247 |
| | | | | 378/62 |
| 2012/0126116 A1* | 5/2012 | Tanaka | .................. | G01B 15/04 |
| | | | | 250/307 |
| 2013/0112871 A1* | 5/2013 | Nara | .................... | G01R 31/311 |
| | | | | 250/307 |
| 2013/0300854 A1* | 11/2013 | Dong | .................... | H01J 37/222 |
| | | | | 348/80 |
| 2014/0226003 A1* | 8/2014 | Phaneuf | ................ | H01J 37/222 |
| | | | | 348/80 |
| 2017/0053777 A1* | 2/2017 | Shojo | ..................... | H01J 37/09 |

* cited by examiner

F I G. 5
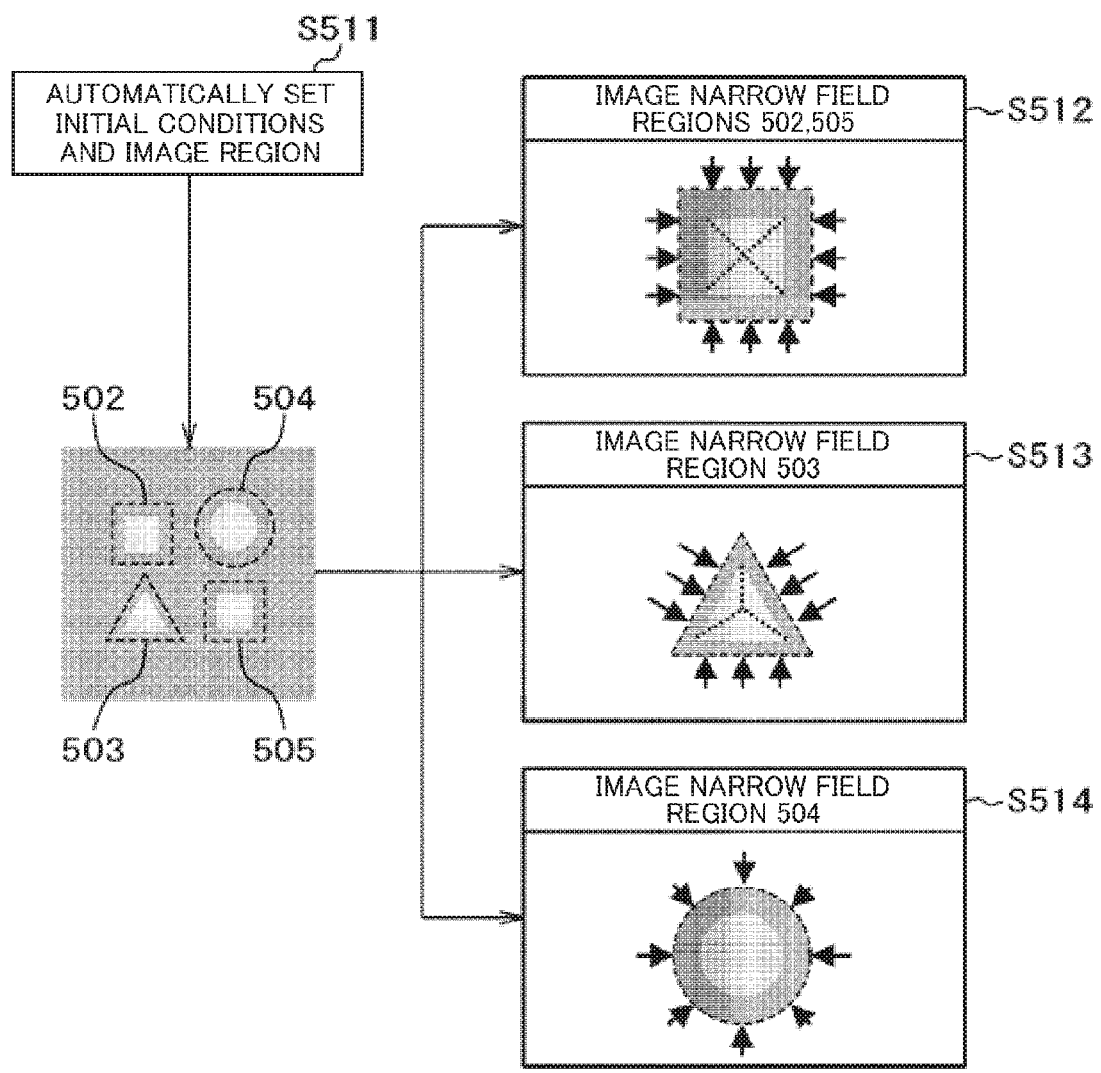

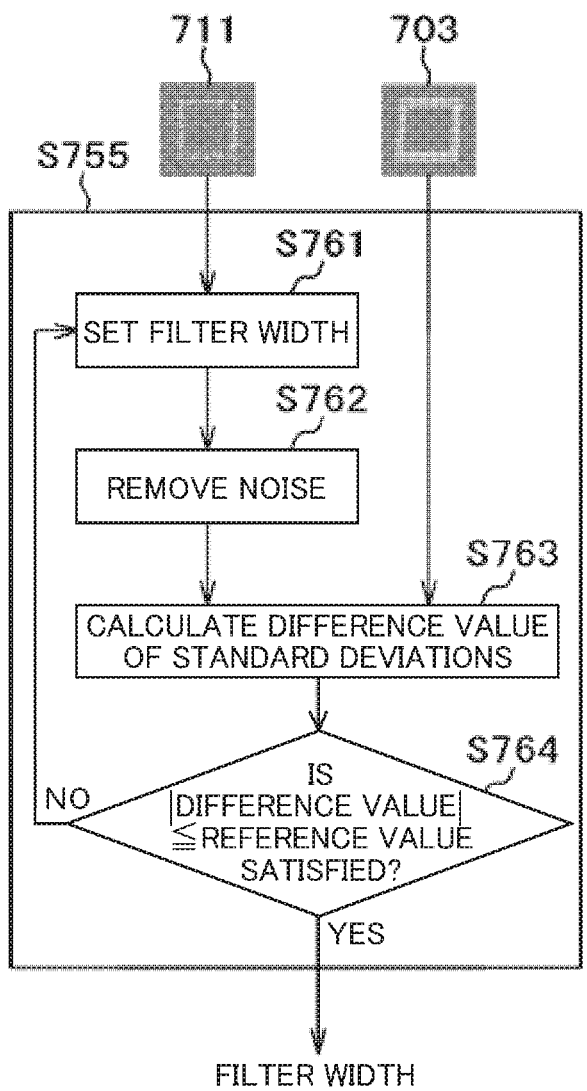

FIG. 8A

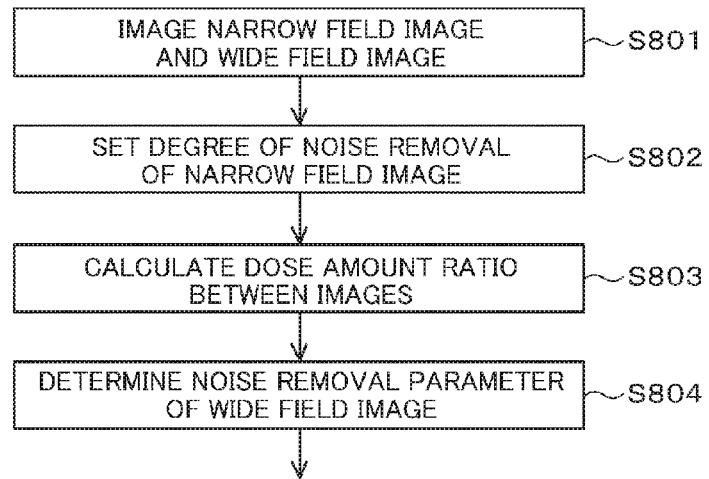

- IMAGE NARROW FIELD IMAGE AND WIDE FIELD IMAGE — S801
- SET DEGREE OF NOISE REMOVAL OF NARROW FIELD IMAGE — S802
- CALCULATE DOSE AMOUNT RATIO BETWEEN IMAGES — S803
- DETERMINE NOISE REMOVAL PARAMETER OF WIDE FIELD IMAGE — S804

FIG. 8B

| | NARROW FIELD IMAGE | WIDE FIELD IMAGE |
|---|---|---|
| 821 — DOSE AMOUNT | $\alpha$ | $\beta$ $(=\alpha/k)$ |
| 822 — STANDARD DEVIATION OF NOISE BEFORE NOISE REMOVAL | $\sigma(\alpha)$ | $\sigma(\beta)$ $(=\sigma(\alpha)\sqrt{(k)})$ |
| 823 — FILTER WIDTH (NOISE REMOVAL PARAMETER) | $s \times s$ | $s\sqrt{(k)} \times s\sqrt{(k)}$ |
| 824 — NOISE REMOVAL EFFECT | $1/s$ TIMES STANDARD DEVIATION | $1/(s\sqrt{(k)})$ TIMES STANDARD DEVIATION |
| 825 — STANDARD DEVIATION OF NOISE AFTER NOISE REMOVAL | $\sigma(\alpha)/s$ | $\sigma(\alpha)/s$ |

Column headers: 810, 811, 812

ELECTRON MICROSCOPE DEVICE AND IMAGING METHOD USING SAME

TECHNICAL FIELD

The present invention relates to an electron microscope device for imaging a wide field region with a high image quality at a high speed with an electron microscope, and an imaging method using it.

BACKGROUND ART

The electron microscope has an extremely high resolution compared with optical microscopes, and is widely used in order to observe a detailed structure of an object to be observed clearly. The electron microscope acquires an image of an object sample by irradiating an electron beam onto the object sample and detecting particles (electrons of the same kind or of a different kind of the irradiated electrons, or electric magnetic wave, or photons) emitted from the object sample or penetrating the object sample with a detector. Observation objects of the electron microscope include materials, semiconductors, food, biotechnology, medical fields, etc.

In inspections and analyses using the electron microscope, there is a demand of wishing to check a whole image of a structure and its distribution in a wide range and there is a need of wishing to perform observation in a captured image whose visual field is wide with a large number of pixels (hereinafter referred to as a wide field image). In addition, also in the wide field image, a high-image-quality image, i.e., an image of a high image quality, with a high S/N ratio, and of a small drift, is required.

As common imaging methods of the electron microscope, there are a high-speed (frame integration) scanning mode whereby an image is acquired by integrating two or more pieces of image data of the same visual field acquired by scanning at high speed and a low-speed scanning whereby one piece of image data of an excellent S/N ratio is acquired by scanning at a low speed. Although in the case of the high-speed scanning, there is little influence of the drift of a stage or a beam, in the case of the low-speed scanning, distortion of an image occurs because the imaging position of the structure in the image shifts during the scanning. Meanwhile, although a high-speed scanning mode has small distortion, since dislocation between frames cannot be eliminated, if the images are integrated as they are, there will be a problem that a combined image will be blurred. For this reason, conventionally, an imaging method of re-imaging a region that is wished to be observed in detail at a high magnification after acquiring the whole image at a low magnification is taken; it poses problems that the imaging requires much labor and time.

As means coping with these problems, there is proposed a more advanced imaging method whereby the wide field image of a high image quality is imaged. As the advanced imaging method, there is an imaging method that uses both the high-speed scanning mode and the low-speed scanning mode. For example, Patent Literature 1 describes an imaging method whereby a reference image without image distortion is acquired at a high-speed scanning mode and a captured image is acquired at a low-speed scanning mode for the same region as the reference image at the same magnification, and the captured image is corrected on the basis of the reference image. Patent Literature 2 describes an imaging method whereby a captured image of a low magnification is acquired at a high-speed scanning mode, a captured image of a high magnification is acquired at a low-speed scanning mode, and a reduced image of a region-of-interest image is combined to the captured image.

CITATION LIST

Patent Literature

PTL 1: Japanese Patent Application Laid-Open No. 2012-169233
PTL 2: Japanese Patent Application Laid-Open No. 2012-32205

SUMMARY OF INVENTION

Technical Problem

In a method of Patent Literature 1, while a high-image-quality wide field image can be obtained, it poses problems, a long imaging time and damage to the sample. Moreover, by a method of Patent Literature 2, while a captured image that includes a high-image-quality region of interest in a short time can be obtained, it poses a problem that image quality in a region other than the region of interest is low. Because of these problems, it can be said that the conventional method is difficult to achieve both a short imaging time and a sufficient image quality over the whole wide field image.

In contrast to this, in the present invention, paying attention to a fact that higher emphasis is placed on that the region of interest is of a high image quality even in imaging the wide field image, the present invention provides an electron microscope device that images the wide field image such that the region of interest is of a high image quality and regions other than it also have sufficient image quality for observation at high speed, and an imaging method using it.

Solution to Problem

In order to address the above-mentioned problems, in the present invention, the electron microscope device is configured to have: an electron microscope that acquires an image of a sample by irradiating and scanning a focused electron beam onto the sample; a processing unit for setting processing conditions for acquiring the image of the sample with this electron microscope; an image processing unit for processing the image of the sample acquired by the electron microscope; an input/output unit that inputs the conditions for acquiring the image of the sample with the electron microscope and outputs a result obtained by processing in the image processing unit; and a control unit for controlling the electron microscope, the image processing unit, and the input/output unit, in which the image processing unit is configured to have: an image region setting unit that sets a wide field region of a relatively wide visual field for acquiring the image of the sample with the electron microscope and a narrow field region of a relatively narrow visual field included in the inside of this wide field region; a parameter determining unit for determining a parameter related to image improvement processing of the wide field image and a narrow field image acquired with the electron microscope in the wide field region and the narrow field region that were set by this image region setting unit; an image quality improvement processing unit for performing image quality improvement processing of the wide field image and the narrow field image based on the parameter determined by this parameter determining unit; and an image combining unit for combining images corresponding to the wide field region on which the image quality improvement processing is performed by this image quality improvement unit.

Moreover, in order to address the above-mentioned problems, in the present invention, the imaging method using an electron microscope device is configured to have the steps of: setting the initial conditions for acquiring the image of the sample using the electron microscope; acquiring the wide field image of the sample by irradiating and scanning a focused electron beam onto the wide field region of the sample using the electron microscope based on this set initial conditions; setting the narrow field region narrower than the wide field region in the inside of the wide field region by processing this acquired wide field image; acquiring the narrow field image of the sample by irradiating and scanning the focused electron beam onto the narrow field region being set in the sample using the electron microscope; determining an image quality improvement parameter of the acquired wide field image and narrow field image; performing the image quality improvement processing of the wide field image and the narrow field image using this determined image quality improvement parameter; combining these wide field image and narrow field image on which the image quality improvement processing was performed; and displaying the image corresponding to this combined wide field region.

Furthermore, in order to address the above-mentioned problems, in the present invention, the imaging method using an electron microscope device is configured so as to: acquire the wide field image of the sample by irradiating and scanning the focused electron beam on the wide field region of the sample using the electron microscope with a low dose amount; set a narrow field region of a relatively narrow visual field included in the inside of the wide field region from this acquired wide field image; acquire the narrow field image of the sample by irradiating and scanning the focused electron beam on the narrow field region that was set using the electron microscope; determine respective noise removal parameters of the wide field image and the narrow field image being acquired; perform the image quality improvement processing on the wide field image and the narrow field image based on each of these noise removal parameters being determined; drift correct the narrow field image on which the image quality improvement processing was performed using the wide field image on which this image quality improvement processing was performed; and combine the narrow field image on which this drift correction was performed and the wide field image.

Furthermore, in order to address the above-mentioned problems, in the present invention, an imaging method using an electron microscope device is configured: to acquire the wide field image including the narrow field image of the sample as a one sheet of frame image by irradiating and scanning an electron beam focused in the wide field region and the narrow field region included in this wide field region onto the narrow field region with a relatively high dose amount and onto the wide field region other than the narrow field region with a relatively low dose amount using the electron microscope; to perform the image quality improvement processing on this frame image; and to acquire an image obtained by drift correcting multiple images about the frame image on which this image quality improvement processing was performed and by subjecting them to frame addition; and to display it.

Advantageous Effects of Invention

According to one aspect of the present invention, it is possible to provide an electron microscope device capable of acquiring a high-image-quality wide field image for a relatively short time with respect to imaging of an electron microscope, and an imaging method using it. Moreover, it is possible to provide an electron microscope device capable of automatically setting a dose amount per pixel in the narrow field region or the wide field region properly, and an imaging method using it.

BRIEF DESCRIPTION OF DRAWINGS

FIG. 5 is a flow diagram showing a flow of processing of setting a scanning method from structure information of the wide field region according to the first example of the present invention and performs imaging.

FIG. 7B is a flow diagram showing a flow of processing of judging a filter width in the processing of creating the combined image from an image of the wide field region obtained by imaging with a low-dose amount according to the first example of the present invention.

FIG. 8A is a flow diagram showing a flow of another method of processing of determining the filter width in the processing of creating the combined image from an image of the wide field region obtained by imaging with a low-dose amount according to the first example of the present invention.

FIG. 8B is a table showing parameters of image noise between the narrow field image and the wide field image in comparison according to the first example of the present invention.

DESCRIPTION OF EMBODIMENTS

Figure 1:
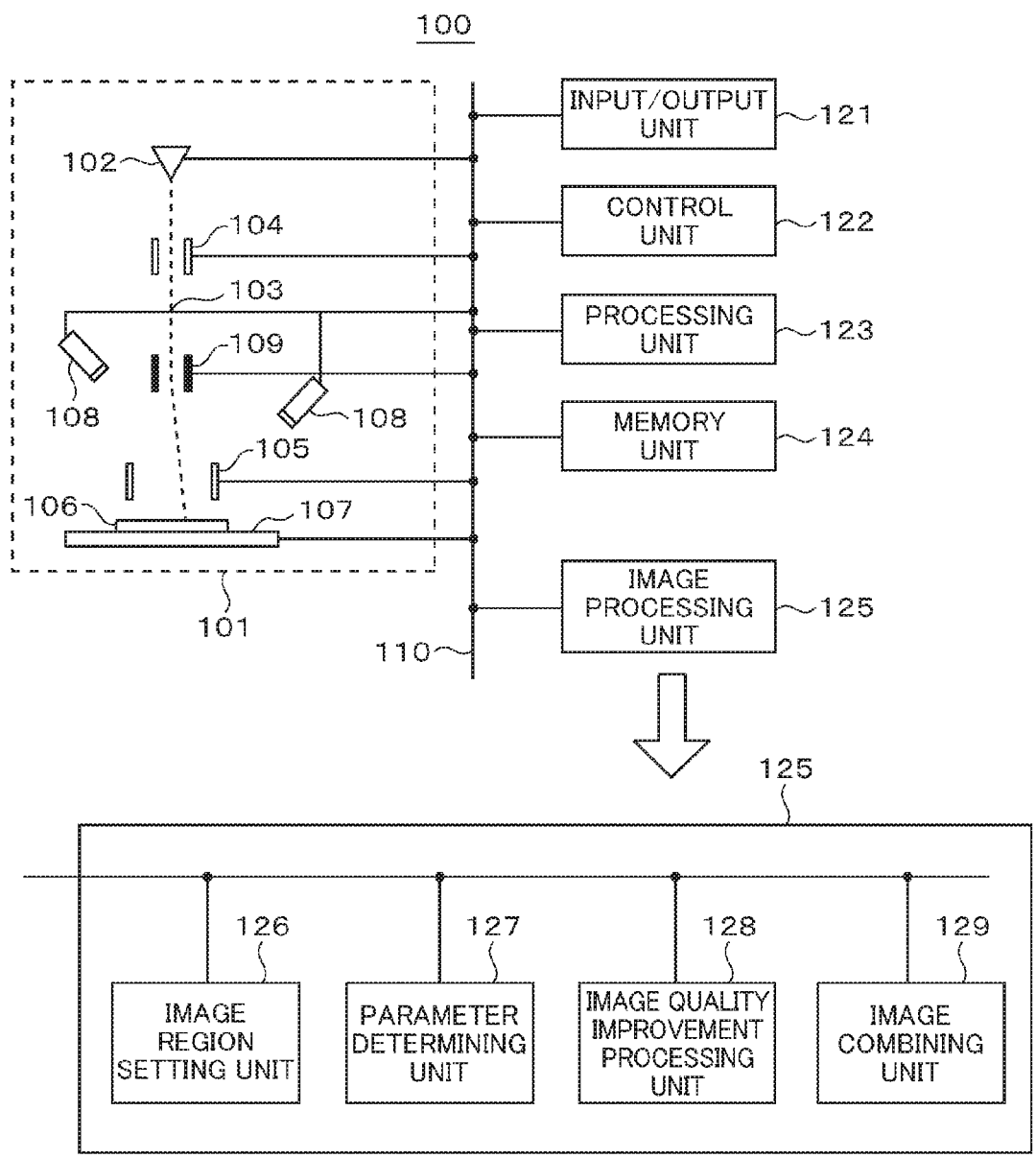
FIG. 1 is a block diagram showing an outline configuration of a scanning electron microscope device according to first and second examples of the present invention.

The present invention relates to an electron microscope for acquiring an image of a sample by irradiating electrons on the sample, especially to a method for acquiring a wide field image with a high image quality in a relatively short time, and a device for it, having the following features.

(1) The present invention is characterized in that respective images of the wide field region and one or more narrow field regions included in this region (hereinafter referred to as narrow field images) are imaged so that the dose amount irradiated on a real region corresponding to one pixel of the captured image (hereinafter referred to as a dose amount) may become larger in the narrow field image than in the wide field image, the wide field image and the narrow field image are combined while performing the noise removal processing in such a way that the fewer the dose amount in each region, the more intense the degree of noise removal becomes.

Thereby, since the wide field image is imaged at a high speed with a relatively few dose amount and the narrow field image is imaged so that the dose amount may become relatively much, shortening of an imaging time becomes possible. Moreover, since noise removal processing is performed on each region according to a dose amount, it is possible to obtain a combined image of an excellent S/N ratio. Here, the narrow field region is a region that is set in one or more of regions that include the sample that is wished to be observed in the wide field image and much of its structure information (for example, edge information of an uneven pattern formed on the sample) or a user's region of interest. The narrow field region may be set by layering two or narrower field regions. Moreover, it is not necessarily required to image the whole wide field region and all the regions of the narrow field regions, and there may be a case where a part of a specific region is imaged. Incidentally, regarding the wide field image and the narrow field image, an image may be acquired by combining image data of the same region in one or more sheets like a high-speed scanning mode.

(2) Moreover, the present invention is characterized by automatically setting the wide field region or the narrow field region based on one or more pieces of information among a user's input and the structure information judged from a brightness change in the narrow field image or the wide field image.

Thereby, it is possible to shorten a time required to set the conditions before the imaging as compared with a case where the narrow field region in the wide field image is manually set or the wide field region is manually set from one or more narrow field images. Furthermore, by teaching the region of interest, design data, etc. as of the user's input as the narrow field region or the wide field region, setting precision of the region that is to be automatically set improves and it becomes possible to shorten the imaging time more efficiently. Moreover, since a region is automatically set from the structure information judged from the brightness change in the image, it becomes possible to shorten the imaging time even for a sample whose structure is unknown. Incidentally, the user's input and a shape of the wide field region or the narrow field region are arbitrary.

(3) Moreover, the present invention is characterized by correcting the drift of one or more narrow field images using the structure information.

By referring to the structure information calculated from the wide field image whose drift amount is small and by correcting drift of one or more narrow field images whose drift amount is larger than that of the wide field image, it becomes possible to acquire the combined image whose drift amount is small in one or more narrow field regions. Moreover, by referring to the structure information calculated from the first narrow field image whose drift amount is small and correcting one or more second narrow field images that are included in the first narrow field image and are larger in drift amount than the first narrow field image, it becomes possible to acquire the combined image whose drift amount is small in one or more second narrow field regions. Incidentally, after the second narrow field image or subsequent ones, it becomes possible to acquire the combined image similarly by performing drift correction in the case where the narrow field image includes a narrow field image whose region is small.

(4) Moreover, the present invention is characterized by judging the structure information in the image from the brightness change in the narrow field image or the wide field image on which image quality improvement processing was performed.

Since in the narrow field image or the wide field image, the smaller the drift amount, the lower the S/N ratio becomes, it is difficult to judge the structure in the image. In contrast to this, by judging the structure in the image from the image whose S/N ratio is improved by the image quality improvement processing, it becomes possible to extract more structure information from the image whose drift amount is smaller.

(5) Moreover, the present invention is characterized by automatically changing a magnification and a scanning method based on one or more pieces of information among the user's input and the structure information.

It becomes possible to shorten the imaging time by imaging the user's region of interest or a region including more structure information at a normal magnification and by imaging regions other than those at a low magnification. Here, although the following becomes a trade-off with shortening of the imaging time, it also becomes possible to image the user's region of interest or a region including more structure information at a high magnification.

Moreover, by automatically setting the scanning method according to characteristics and a shape of an imaging object from the user's input or the structure information, it becomes possible to image an image that is less affected by the impact of the charge, and an image whose edge parts are clearly pictured, etc.

(6) Moreover, the present invention is characterized by combining the images so that the degrees of noise in all the regions of the combined image may become the same level.

Thereby, the combined image with the sufficient visibility such that the S/N ratios of the whole image are equalized can be obtained. Incidentally, regarding the S/N ratio that should be equalized in the whole image, as long as it is a sufficient S/N ratio to observe the sample in the image, it may be a highest S/N ratio in each region before the image processing or may be an S/N ratio that was taught by the user in advance or the like.

(7) Moreover, the present invention is characterized by automatically adjusting a parameter of the image quality improvement processing in each region of the combined image based on intensity of noise removal.

By the noise removal processing, while the S/N ratio of each region improves, signals of high frequency components, such as of the edge part, deteriorate. In contrast to this, it becomes possible to improve the visibility of the image by performing image quality improvement with resolution improvement processing etc. Furthermore, by setting the parameter of the image quality improvement processing based on the intensity of noise removal, a result of the image quality improvement, such as sharpnesses of the edge parts in all the regions of the combined image also becomes comparable, and it becomes possible to obtain the combined image with sufficient visibility.

(8) Moreover, the present invention is characterized by performing the drift correction of one or more narrow field images using an image in process of combination of the wide field image and the narrow field image.

Since as compared with the wide field image, a first narrow field region of the image in process of combination of the wide field image and the first narrow field image has a high S/N ratio and includes more brightness information, it becomes possible to correct the drift of the second narrow field image included in the first narrow field image with a higher precision. Hereinafter, embodiments according to the present invention are explained using drawings.

EXAMPLE 1

A first example of the present invention is described using FIGS. 1 to 8. FIG. 1 shows a basic configuration of a scanning electron microscope device 100 that is one embodiment of the present invention. The scanning electron microscope device 100 is configured with, for example, a scanning electron microscope 101, an input/output unit 121, a control unit 122, a processing unit 123, a memory unit 124, and an image processing unit 125.

The electron image acquisition device 101 generates an electron beam 103 from an electron gun 102, and focuses it on a surface of a sample 106 by making this electron beam 103 pass through a condenser lens 104 and an objective lens 105. Next, it acquires an image by detecting particles generated from the sample 106 on which the electron beam 103 was irradiated with a detector 108. The image is stored in the memory unit 124.

Multiple of the detectors 108 may be provided, and further the following alternatives may be allowed: the multiple detectors 108 are detectors for detecting different particles, like a detector for detecting electrons and a detector for detecting an electromagnetic wave; they are detectors for detecting only particles within a specific range of an energy and a spin direction; or they are detectors for detecting particles of different properties, like a secondary charged particle detector and a backward scattering charged particle detector. Multiple detectors each for detecting particles of same properties may be provided at different arrangement positions. When the multiple detectors are provided, multiple images can be acquired usually by one-shot imaging.

The sample 106 is mounted on a stage 107. By moving the stage 107, acquisition of the image of the sample 106 in an arbitrary position is possible. Moreover, by changing a direction of the charged particle beam 103 two-dimensionally with a beam deflector 109, the electron beam 103 can be scanned on the sample two-dimensionally.

The input/output unit 121 performs inputting of an image acquisition position, imaging conditions, and an image combination condition, and outputting of displaying the combined image obtained by imaging on a screen, transmitting a result of inspection to the outside, etc. The control unit 122, acting to control the imaging device, controls a voltage applied to the electron gun 102, focal positions of the condenser lens 104 and the objective lens 105, a position of the stage 107, a deflection degree of the beam deflector 109, etc. Moreover, the control unit 122 also performs control of the input/output unit 121, the processing unit 123, the memory unit 124, and the image processing unit 125. Furthermore, the control unit 122 changes an imaging method according to each region being set by an image region setting unit 126 of the image processing unit 125.

The processing unit 123 performs various processing, such as processing related to automatic focusing necessary to set a focus position of the electron beam 103 on a surface of the sample 106. The memory unit 124 saves the captured image, the image after the image quality improvement, and a halfway result in image combination, various processing parameters, etc. In the image processing unit 125, image processing to the acquired data is performed.

The image processing unit 125 has the image region setting unit 126, a parameter determining unit 127, an image quality improvement processing unit 128, and an image combining unit 129. The image region setting unit 126 sets the wide field region or one or more narrow field regions. The parameter determining unit 127 performs processing of determining the parameter related to the image quality improvement processing for each region. The image quality improvement processing unit 128 performs the image quality improvement processing for each region. The image combining unit 129 performs the drift correction of the image of each region and image combining processing. By the image processing unit 125 being configured with hardware capable of high-speed calculation, such as a GPU (Graphics Processing Unit), it becomes possible to perform processing simultaneously together with the imaging, and to further enhance an effect of shortening the imaging time.

Figure 2:
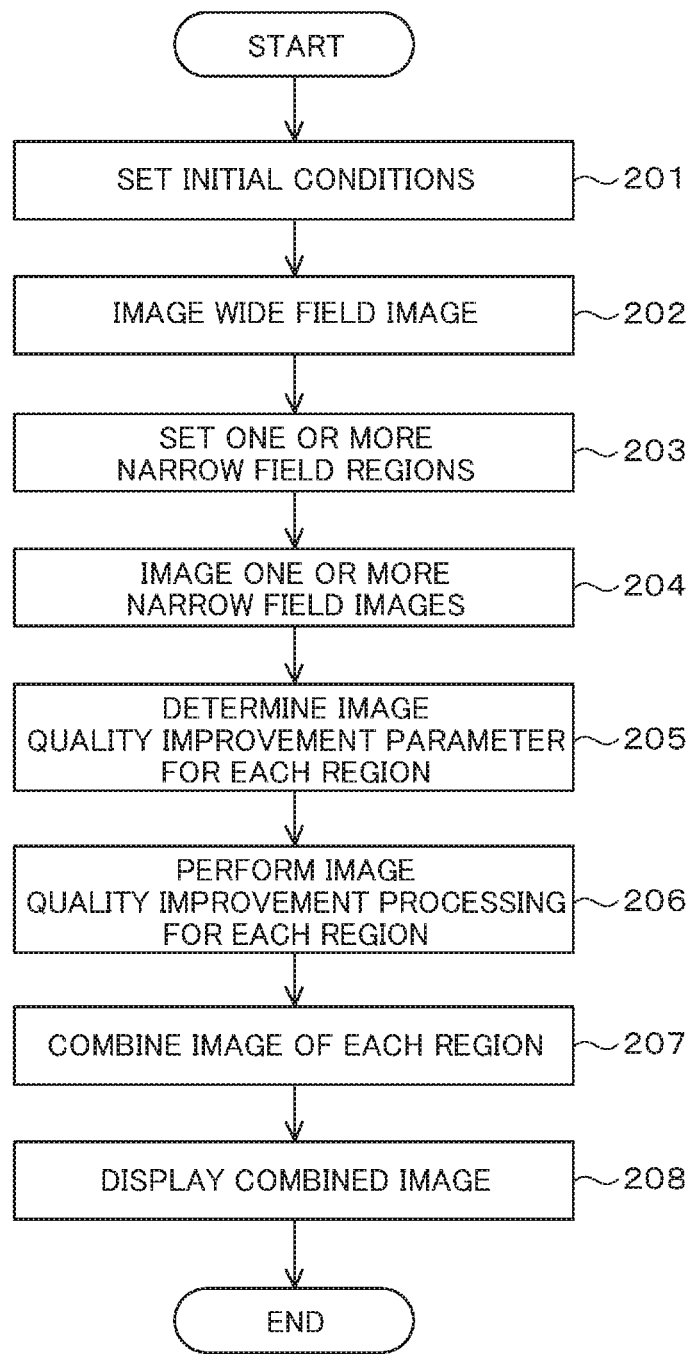
FIG. 2 is a flow diagram showing a flow of processing of creating a combined image by image quality improvement processing according to the first example of the present invention.

FIG. 2 is a flow diagram showing an outline of a flow of processing using the scanning electron microscope 100 shown in FIG. 1 in the first example, and is a diagram showing one example of a sequence whereby the wide field image and the narrow field image are imaged by changing the dose amount and all the regions of the image after the combination in which S/N ratios have equalized to be sufficient for observation by the image quality improvement processing.

In Step S201, the initial conditions of automatically setting the image region is set. The user sets: a region of the image and the quality of the image in which structure information is judged, a type of region setting, existence of teaching the imaging object, imaging magnification, and the region of interest. In Step S202, the wide field image is imaged in which the structure information is judged. Incidentally, the imaging of the narrow field image together with the wide field image may be set by the initial conditions. One or more regions among the wide field region or one or more narrow field regions are used as the regions in which the structure information is judged. Incidentally, when performing teaching from the captured image of the initial conditions, the initial conditions may be added after the imaging. In Step S203, one or more narrow field regions are automatically set in the image region setting unit 126 based on the structure information and the region of interest being set by the user. Incidentally, there may be a case where the narrow field regions are set to the same region in duplicate. A concrete example of this will be described later.

In Step S204, one or more narrow field regions that were automatically set are imaged. Although the imaging turn of these region is arbitrary, the dose amount is set so that the dose amount of the narrow field image may become large compared with that of the wide field image. For this reason, compared with the wide field image, the narrow field image has a high S/N ratio. Moreover, the dose amount of the narrow field region is set, for example, so that the smaller the area of the region of the narrow field region relative to the wide field region, the larger the dose amount may become. Here, what is meant by a setting of increasing the dose amount is realized by slowing down the scanning speed of the electron beam or enlarging an irradiation current. Further, a sampling error may be reduced by the combination with making pixel size small. Moreover, the wide field image and the narrow field image may be acquired as an image that combines image data in the same region like the high-speed scanning mode.

In Step S205, the image quality improvement parameter is determined in the parameter determining unit 127 for each region of the wide field image and one or more narrow field images. Here, as the image quality improvement processing by the image processing, there are noise removal, resolution improvement, edge enhancement processing, etc. A method for determining the image quality parameter will be described later. In Step S206, the image quality improvement processing is performed for each region in the image quality improvement processing unit 128 with the parameter value being set in Step S205.

In Step S207, the image of each region that is subjected to the image quality improvement processing in Step S206 is combined in the image combining unit 129. As combination methods of images, there is a method whereby replacement, integration, or weighted addition of a pixel value is performed. At this time, when the pixel size of the narrow field image is smaller than the pixel size of the wide field image, what is necessary is just to perform the combination processing by scaling the pixel size of the wide field image to the pixel size of the narrow field image. Although the number of pixels of the wide field image increases at this time, what is necessary is just to determine a pixel value of the increment by interpolating a brightness value of the original image. Moreover, it is preferable that an image to be combined is an image that was drift corrected. In Step S208, the image that was combined in Step S207 is displayed.

Since, by these steps, only the narrow field region that is the user's region of interest is imaged with a large dose amount compared with other regions, it becomes possible to acquire the whole image and a high-image-quality image of the region of interest in a short imaging time compared with a case where all the wide field regions are imaged with a large dose amount.

Figure 3A:
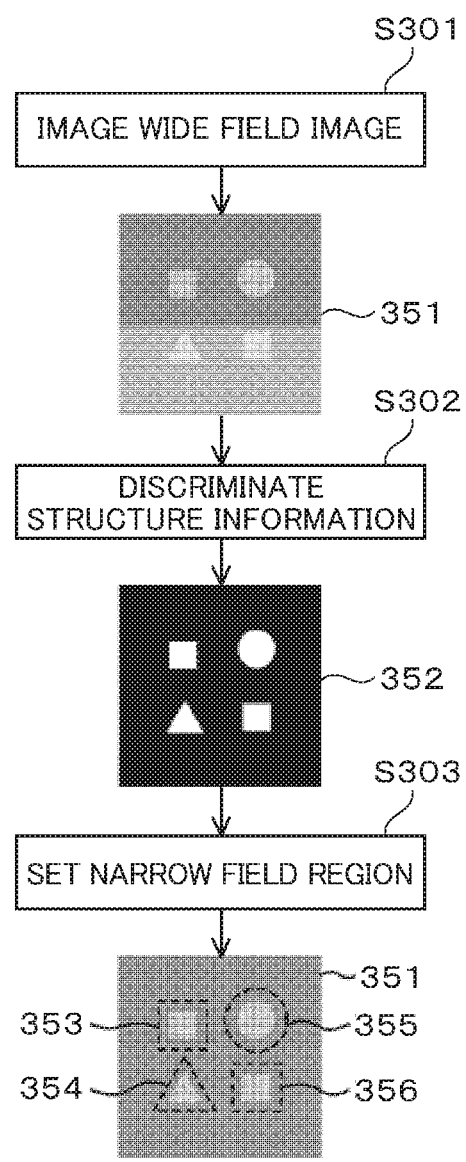
FIG. 3A is a flow diagram showing a flow of processing that sets a narrow field region according to the first example of the present invention.
Figure 3B:
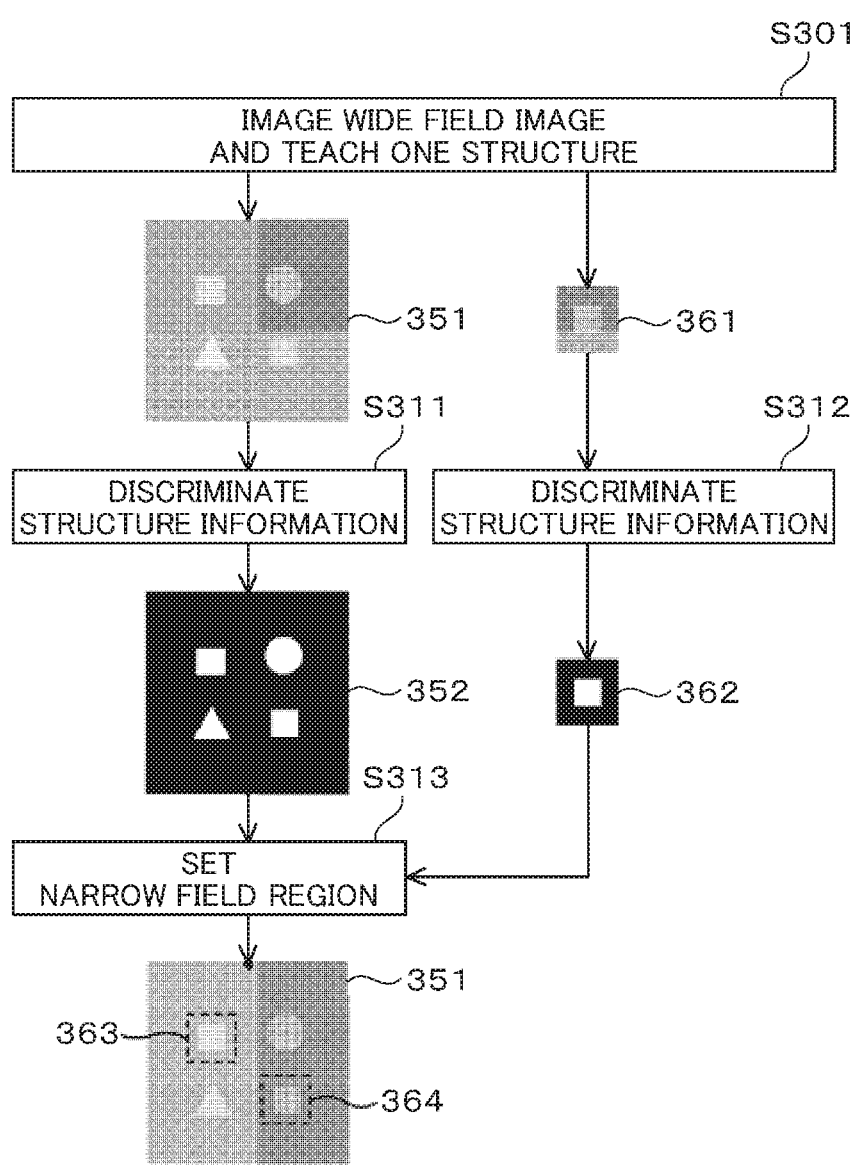
FIG. 3B is a flow diagram showing a flow of processing that teaches a structure according to the first example of the present invention, and sets the narrow field region.

FIG. 3A and FIG. 3B are diagrams of one example showing an example in which the narrow field region is automatically set from a user's input or the structure information. FIG. 3A and FIG. 3B correspond to Steps S201 to S203 of the flow shown in FIG. 2.

The flow diagram shown in FIG. 3A is an example of setting the narrow field region using image features of the wide field image. In Step S301, the wide field image specified by the initial conditions is imaged to acquire a wide field image 351. This Step S301 corresponds to Step S202 of the flow diagram of FIG. 2. In Step S302, the structure information is discriminated to the wide field image 351 and structure information 352 is acquired. Step S302 corresponds to Step S203 of the flow diagram of FIG. 2.

In judgment of the structure information in Step S302, for example, a binarized image that is obtained by performing edge extraction of an uneven pattern contained in the wide field image 351 with a Laplacian filter, and designating a region surrounded by an edge as 1 and regions other than it as 0 is outputted as the structure information 352. Incidentally, in the case where the narrow field regions are set duplicately, for discrimination of the second field region included in the first field region, a size of the region surrounded by the edge is compared and labeling processing is also performed on the structure information. In Step S303, narrow field regions 353 to 356 are automatically set to the wide field image 351 based on the structure information 352. Step S303 corresponds to Step S203 of the flow diagram of FIG. 2.

Here, by specifying that the narrow field regions 353 to 356 to be set to be a range including surroundings of the structure to be targeted, it becomes possible to effectively perform correspondence to delicate dislocation at the time of imaging and combining with the wide field image. For example, the above-mentioned region may be a region in which a pixel value of a mask image obtained by performing expansion processing on the structure information 352 is set to 1.

Moreover, although FIG. 3A showed the example in which the complicated shape was used as the narrow field region as it was, a rectangular region including these may be set as it is. This is because, in image acquisition, the rectangular region is easy to handle with respect to ease of setting of electron beam scanning conditions, management of image saving memory, etc.

In the above-mentioned example, although the region surrounded by the edge was set as the narrow field region, needless to say, another image feature amount may be used, such as evaluating a density of the edge whose intensity is high to some extent and designating a region of a high density as the narrow field region. In that case, what is necessary is just not to do template matching but to select a region having the same feature amount as the narrow field region. Regarding the narrow field region thus being set, by acquiring the narrow field region under conditions of more dose amount than that of the wide field image, it becomes possible to acquire an image of a high image quality on the region of interest. It becomes possible to acquire an image of a high image quality only of the region of interest efficiently by combining these images.

Since this technique sets a region according to the structure information judged from the brightness change in the image, it becomes possible to extract automatically the region of interest as the narrow field region even in imaging where a position of the structure in the wide field region is unknown. Thereby, it is possible to shorten a time required to set the conditions before the imaging as compared with a case where the user manually sets the narrow field region in the wide field region and images it individually. Furthermore, this enables the image region to be narrowed, making it possible to shorten the imaging time more efficiently.

As another example, an example in which the user sets the narrow field region by inputting information of the region of interest in advance is explained using the flow of FIG. 3B. In Step S310 of FIG. 3B, the user sets the region of interest as a teaching image 361, in addition to the initial conditions of Step S301 explained in FIG. 3A. Step S310 corresponds to Steps S201 and S202 of the flow diagram of FIG. 2. In Step S311, the wide field image 351 is processed as in the case of Step S302 of FIG. 3A, and the structure information 352 is acquired. In Step S312, structure information 362 is acquired from the teaching image 361 as in the case of Step S302. Steps S311, S312, and S313 correspond to Step S203 of the flow diagram of FIG. 2.

In Step S313, narrow field regions 363, 364 are set to the wide field image 351 based on the structure information 352, 362. In Step S313, template matching is performed to a structure 352 using the structure information 362 as a reference image in a pretreatment of Step S303, and only the regions 363, 364 that are matched are set. This teaching image 361 that is the region of interest may be selected from the wide field image, or naturally, the wide field image such that the teaching image 361 was imaged separately in advance and was imaged with a different visual field may be applied.

By teaching the imaging object as the user's input through processing by a flow as shown in FIG. 3B, the image region to be set is narrowed, and it becomes possible to shorten the imaging time more efficiently.

Figure 4:
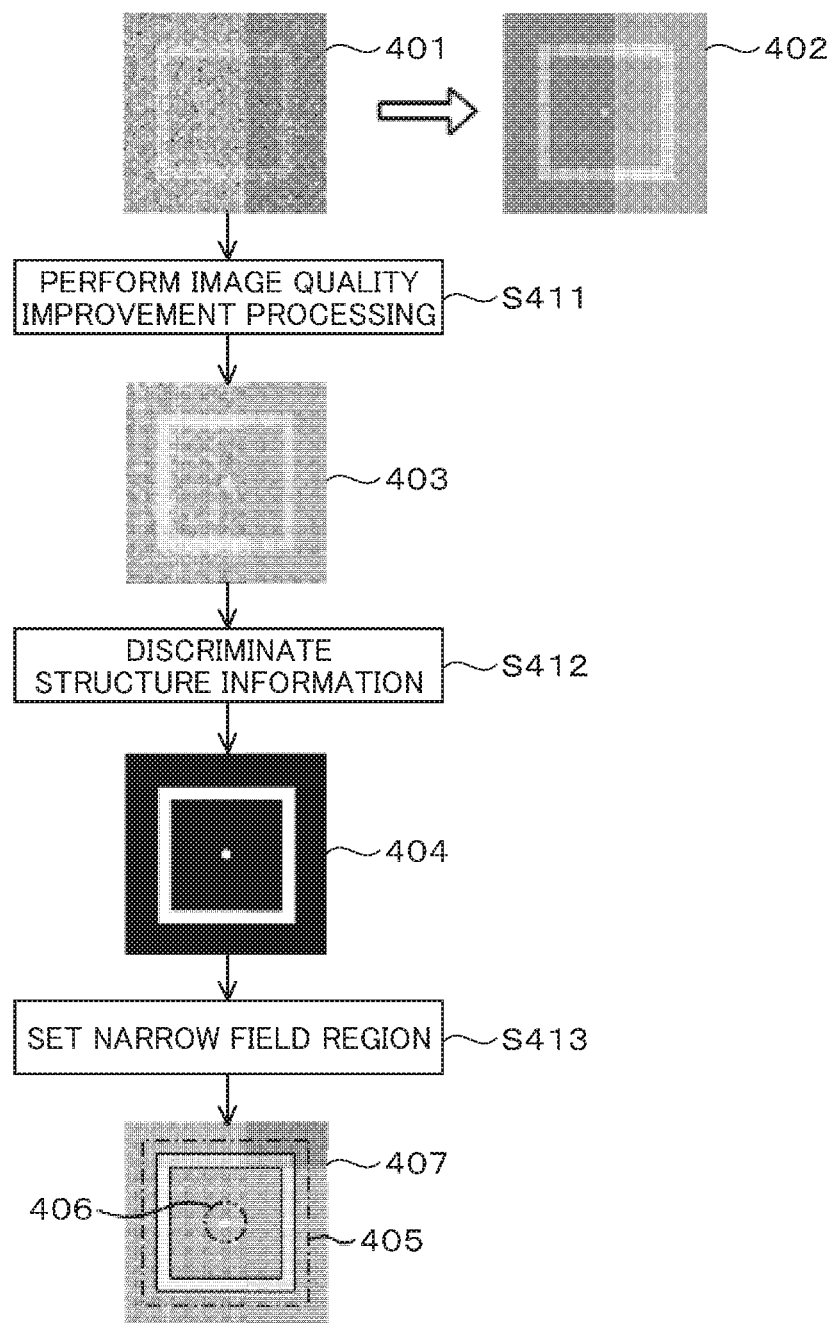
FIG. 4 is a flow diagram showing a flow of processing that performs the image quality improvement processing of an acquired wide field image according to the first example of the present invention, and sets the narrow field region.

FIG. 4 is a diagram showing an example in which the image quality improvement processing is applied to the wide field image acquired by imaging, the structure information is judged from the brightness change in the wide field image after the image quality improvement, and the narrow field region is set. FIG. 4 corresponds to Steps S201 to S203. An image 401 is the wide field image acquired by imaging. Here, an ideal image of the wide field image corresponding to the image 401 is shown in an image 402 for explanation.

In Step S411, the image quality improvement processing is performed on the image 401 to obtain a wide field image 403 whose image quality is improved as an output. As the image quality improvement processing of Step 411, there are noise removal with a moving average filter, image restoration processing with a Wiener filter, etc., for example.

In Step S412, as in the case of Step S302 of FIG. 3A, the structure information is discriminated from the image 403 and structure information 404 is acquired. Here, since the S/N ratio of the image 403 was improved by the image quality improvement processing of Step S411, it becomes possible to discriminate the structure information buried in noises in the image 401.

In Step S413, the narrow field region is set as in the case of Step S303 of FIG. 3A based on the structure information 404. An example of FIG. 4 shows an example in which the narrow field region is nested independently, which is different from the example of FIG. 3. This is effective when observing a more detailed structure in the narrow field image with a high image quality. Finally, a first narrow field region 405 and a second narrow field region 406 included in it are set to the wide field region.

Thus, regarding a two-stage narrow field regions thus being set, it becomes possible to acquire an image of a high image quality about the region of interest by acquiring the first narrow field image under a condition that a dose amount is larger than that of the wide field image and by acquiring the second narrow field image under a condition that the dose amount is still larger than that of the first narrow field image. It becomes possible to acquire an image efficiently whose image quality is high only in the region of interest by combining these images.

By these achievements, by judging the structure in the wide field image with a low S/N ratio, it becomes possible to extract more structure information from the image whose drift amount is smaller. Moreover, since the second narrow field image from which more detailed brightness information is acquired is set to the first narrow field image, it becomes possible to acquire an image having more detailed information about the structure.

FIG. 5 is showing an example in which the scanning method for imaging the narrow field region with a better quality of image from the structure information of the wide field region is automatically set and the imaging is performed. FIG. 5 corresponds to Steps S201 to S204 of the flow diagram of FIG. 2.

Step S511 is setting of the initial conditions corresponding to Step S201, and is the same as Steps S301, S302, and S303 explained in FIG. 3A except for that the user sets the scanning method from the structure information, and corresponds to Steps S201 to S203 of the processing flow explained in FIG. 2. In Step S511, regions 502 to 505 are set as the narrow field regions.

Steps S512 to S514 correspond to S204 of the flow of FIG. 2, in which the scanning method is set based on the structure information as specified by the user and imaging is performed. Here, for example, in order to image the structure of the edge part more clearly, the method is set so that a scan direction may become perpendicular to the edge of the structure, as indicated by the arrows. Incidentally, the scanning is started as shown by the arrows, and is continued until it reaches a line connecting a center of gravity of each structure or the center of gravity and each peak thereof.

By performing the imaging in a procedure explained in FIG. 5, the scanning method according to a shape of the imaging object can be set from the structure information, and it becomes possible to image the structure, such as of the edge part, more clearly.

Figure 6A:
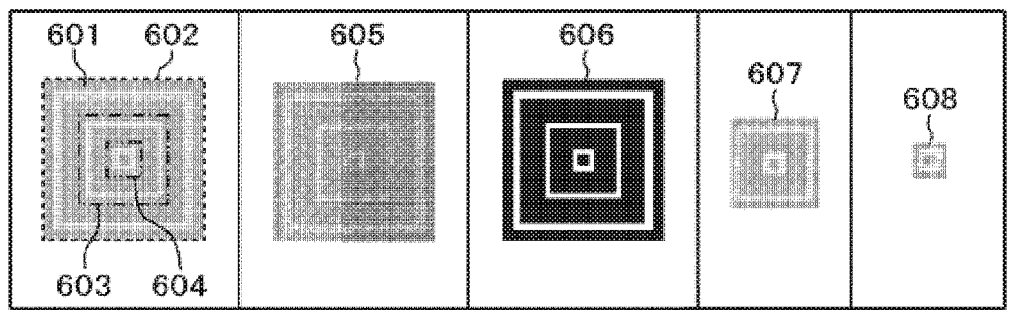
FIG. 6A is a table showing the wide field image, a narrow field image, and the structure information according to the first example of the present invention.

FIG. 6A shows a list of images used for the image combining processing. It shows images of: a wide field image 605 acquired by imaging the sample and an ideal image 601 of a wide field image of a region 602 corresponding to it; structure information 606 in the wide field image 605; a first narrow field region 607; and a second narrow field region 608.

Figure 6B:
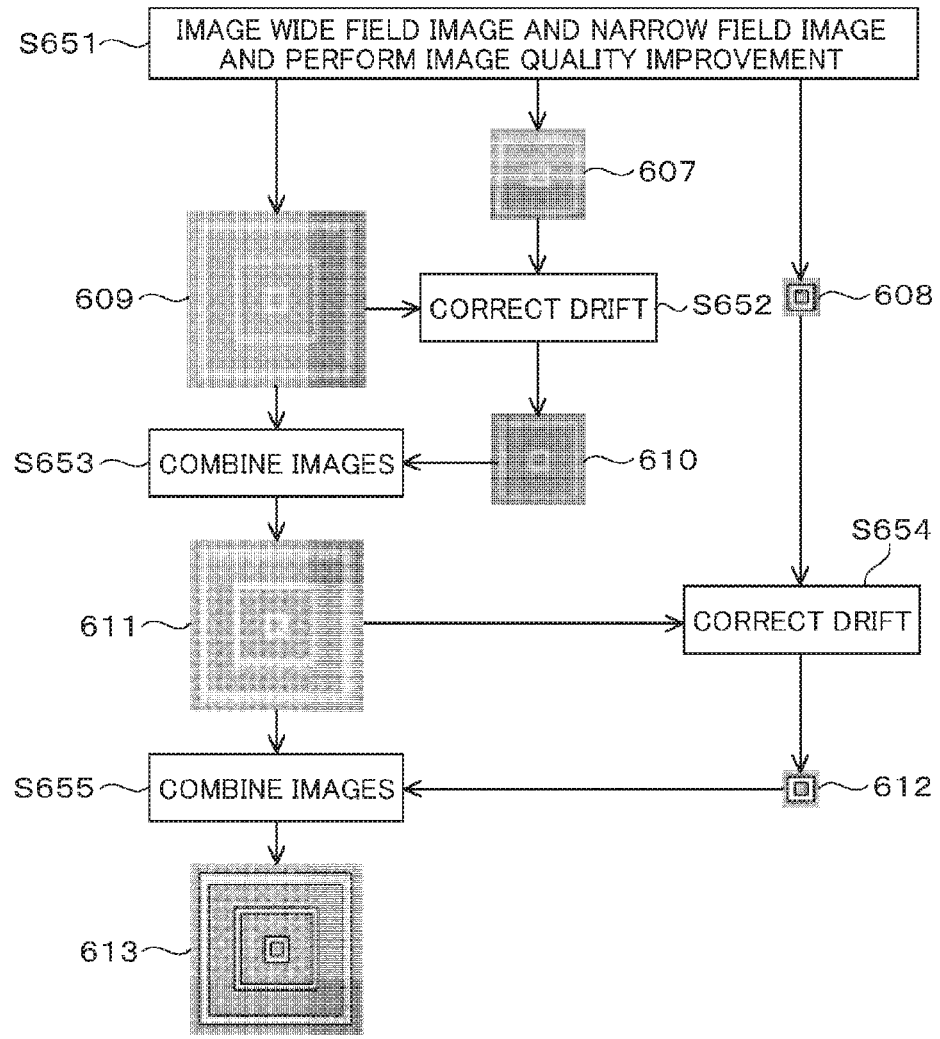
FIG. 6B is a flow diagram showing a flow of processing of creating the combined image from the wide field image and the narrow field image after image quality improvement according to the first example of the present invention.

FIG. 6B shows an example in which a drift of the narrow field image is corrected by using an image in process of combination of the wide field image and the narrow field image or the structure information of the wide field image. By the drift correction, precision of the image combining processing of Step S207 of FIG. 2 improves, and it becomes possible to obtain better image quality. FIG. 6B corresponds to Steps S201 to S207 of the flow diagram explained in FIG. 2.

In Step S651, Steps S201 to S206 of the flow diagram explained in FIG. 2 are processed. In the processing corresponding to Step S202, the wide field image 605 of a small drift amount and with a low S/N ratio is acquired. In the processing corresponding to Step S203, the structure information 606 is acquired from the wide field image 605, and a first narrow field region 603 and a second narrow field image 604 are set. In the processing corresponding to Step S204, the first narrow field image 607 of a large drift amount and with a high S/N ratio and a second narrow field image 608 of a large drift amount and with a high S/N ratio are acquired. In processing corresponding to Steps S205, S206, the image quality improvement processing is performed so that the image 605 may become to have a high S/N ratio and a wide field image 609 of a small drift and with a high S/N ratio is acquired.

In Step S652, the drift correction of the image 607 is performed by using the image 609 as the reference image and a first narrow field image 610 of a small drift amount and with a high S/N ratio is acquired. In Step S653, the image 609 and the image 610 are combined to acquire an image in process of combination 611. In Step S654, the drift correction of the image 608 is performed by using the image 611 as the reference image to acquire a second narrow field image 612 of a small drift amount and with a high S/N ratio. In Step S655, the image 611 and the image 612 are combined to create a combined image 613 of the wide field region.

Here, since the images 607 and 608 are imaged with the dose amount increased and with much time taken to image one sheet of image, the image is distorted under an influence of sample drift etc. For this reason, the drift correction for correcting distortion of the one sheet of image is necessary.

As methods for correcting distortion of an image, there is one as follows. First, an each image obtained by dividing an image with distortion into small regions is template matched to the reference image without distortion and a corresponding region is calculated. Each template image is disposed in a corresponding region being calculated to make one sheet of image and pixels are subjected to interpolation processing in the whole image to acquire an image whose distortion is corrected. Incidentally, as the reference image of the drift correction, the structure information 606 may be used instead of the wide field images 609, 611. Moreover, although the imaging time and precision of the drift correction make trade-off, one more sheet of the first narrow field image of the image 607 of a small drift amount and with a medium S/N ratio may be imaged separately and its structure information may be used as the reference image of the drift correction instead of the wide field images 609, 611.

By these steps, as compared with the wide field image 609, the first narrow field region (region corresponding to the first narrow field image 610) of the image in process of combination 611 of the wide field image 609 and the first narrow field image 610 is high in resolution and includes more brightness information, and therefore it becomes possible to correct the drift of the second narrow field image 604 with a higher precision. Moreover, it becomes possible to refer to the structure information 606 calculated from the wide field image 605 whose drift amount is small, to correct the drift of the first narrow field image 607 whose drift amount is larger than that of the wide field image 609, and to acquire the first narrow field image 610 of a small drift amount. Moreover, although the following makes a trade-off with the imaging time, it becomes possible to refer to the structure information (corresponding to the structure information 606) calculated from the first narrow field image 610 of a small drift amount, to correct the drift of the second narrow field image 608 that is included in the first narrow field image 610 and is higher than the first narrow field image 610 in drift amount (S654), and to obtain the second narrow field image 612 of a small drift amount.

Figure 7A:
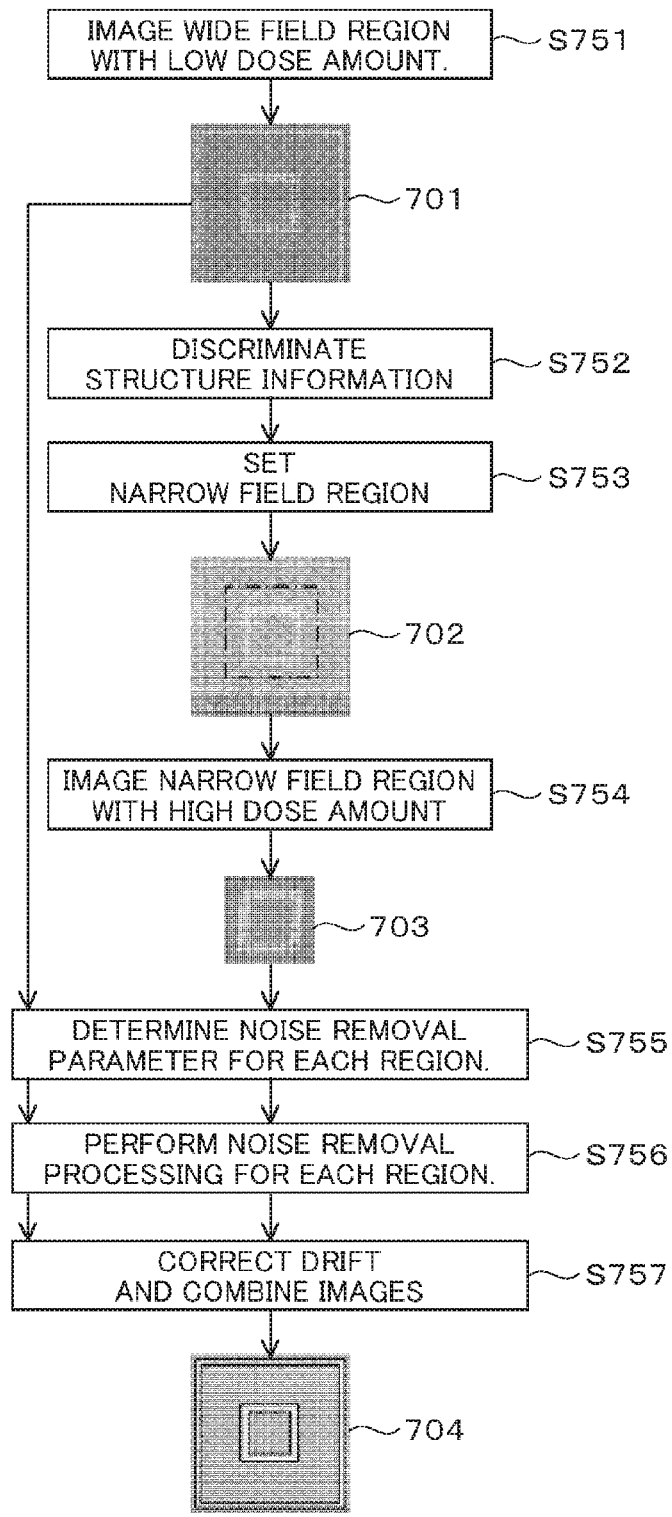
FIG. 7A is a flow diagram showing a flow of processing of creating the combined image from an image of the wide field region obtained by imaging with a low-dose amount according to the first example of the present invention.

FIG. 7A shows an example in which combination is performed so that the degrees of noise in all regions of the combined image may become comparable. The processing shown in FIG. 7A corresponds to Steps S201 to S207 in the flow diagram of FIG. 2. In Step S751, a wide field image 701 of a small drift amount and with a low S/N ratio is acquired. In Steps S752 and S753, the same processing as of Steps S302 and S303 explained in FIG. 3A is performed to set a narrow field region 702. In Step S754, the narrow field region 702 is imaged with a high-dose amount to acquire a narrow field image 703 of a large drift amount and with a high S/N ratio. In Step S755, a noise removal parameter is determined for each region. When the S/N ratio is sufficient regarding the narrow field image 703, for example, the noise removal processing is performed so that the narrow field image 703 may become comparable only to that of the wide field image 701 in degree of noise.

FIG. 7B shows an example of parameter determination in the case of performing the noise removal processing using the moving average filter. Here, the noise removal parameter is a width of the moving average filter.

First, in Step S761, a width of the moving average filter used for the noise removal processing of an image 711 which is an image of the narrow field region extracted from the wide field image is set. The user may specify a filter width of the initial conditions, or may determine it from a table of the dose amount and the filter width formed in advance etc. In Step S762, the noise removal processing is performed on the image 711.

In Step S763, for each of the image 703 and the image 711 that were subjected to the noise removal processing, a standard deviation of the brightness to a brightness average value is calculated, the standard deviation of the image obtained by performing the noise removal processing on the image 711 is subtracted from the standard deviation of the image 703, and a difference value between them is calculated.

In Step S764, an absolute value of this difference value and a reference value that the user set in advance are compared. If an absolute value of the difference value is less than or equal to the reference value, it will be judged that the standard deviation will be comparable, and the filter width will be determined. If the absolute value of the difference value is more than the reference value, the flow will return to Step S761, where the filter width will be set again. If the difference value is positive, the filter width is set to a small value; if the difference value is negative, the filter width is set to a large value. Incidentally, the reference value may be specified by the user, or may be determined from statistical data obtained by performing N integration evaluation in advance.

After this, Steps S761 to S763 are repeated until the absolute value of the difference value becomes lower than or equal to the reference value in Step S764. Incidentally, when the narrow field image 703 has an insufficient S/N ratio and the degree of noise is to be suppressed to a user-specified standard deviation, what is necessary is just to determine the filter width in Steps S761 to S764 also about the image 703 as in the case of the image 711. However, in this case, in Step S763, not using the standard deviation of the image 703, the standard deviation of the image 703 from which the noise is removed is calculated from the user-specified standard deviation or the image 711 from which the nose is removed is subtracted, and a difference value of them is calculated.

In Step S756 of FIG. 7A, the noise removal processing is performed only on the wide field image 701 with a parameter value determined in Step S755. In Step S757, by drift correcting the narrow field image using the wide field image that was subjected to the noise removal processing as in the case of Step S652 explained in FIG. 6B as the reference image, and by combining the narrow field image that was drift corrected with the wide field image that was subjected to the noise removal processing, a combined image 704 of the wide field region is obtained as an output. The output image is an image of a small drift amount and likewise with a high S/N ratio in all the regions. Incidentally, the noise removal processing may be modified to the image quality improvement processing, not only by the noise removal processing alone, but by adding the image restoration processing etc. thereto.

Furthermore, the image quality improvement parameter may be set according to a noise removal parameter value. For example, when performing the image restoration processing with a Wiener filter as the image quality improvement processing, it is necessary to estimate a point spread function of the image corresponding to the noise removal parameter value. For this purpose, what is necessary is just to perform the noise removal processing with a parameter value of Step S755 on the sample image including an edge shape and estimate the point spread function from a blurred edge shape. By this procedure, resolution that was lowered by the noise removal processing in regions other than the narrow field region 702 is improved and resolution also approaches to the same degree in all the regions.

Since these procedures equalize the S/N ratios in the wide field region and the narrow field region of the combined image, it becomes possible to improve the visibility in the entire combined image. Furthermore, by specifying the noise removal processing to be the image quality improvement processing, since resolution is improved in regions other than the narrow field region 702 of the image 704, and the sharpnesses of the edge parts in all the regions of the combined image of the wide field region also become to the same degree, it makes possible to obtain the combined image with further sufficient visibility.

FIG. 8A is a diagram showing a flow of processing of determining the noise removal parameter according to a dose amount. Here, a method for determining another parameter value with respect to Step S755 of FIG. 7 is shown. There is a relationship that when the dose amount becomes 1/k times higher than before, the standard deviation of a shot noise that is dominant in the electron microscope becomes $\sqrt{k}$ times higher than before. In this example, using this relationship, the noise removal parameter is set so that the degree of noise of each image may become comparable.

Step S801 is the same as Steps S751 to S754 explained in FIG. 7A. However, a case is considered where, as shown in Table 810 of FIG. 8B, in a narrow field image 811 and a wide field image 812, each image is imaged at dose amounts 821 of α or β, standard deviations 822 of brightness to the respective brightness averages that are the noise volumes before respective noise removal become σ(α), or σ(β).

In Step S802, the degree of noise removal of the narrow field image is set. For example, when the noise removal is performed with the moving average filter, if the filter widths of an x-direction and a y-direction are changed by t times, respectively, the standard deviation of noise will increase by 1/t times to the processing result before the filter width is changed. Here, a filter width 823 of the noise removal related to the narrow field image 811 is designated as s, and the standard deviation of noise is increased by 1/s times as a noise removal effect 824. Incidentally, the filter width 823 may be specified by the user or may be determined from the table of the dose amount and the filter width that is formed in advance etc.

In Step S803, a ratio of the dose amount 821 of the narrow field image 811 and that of the wide field image 812 is calculated. Here, the ratio of the dose amount 821 is designated as β/α=1/k. Incidentally, from a relationship of the dose amount and the standard deviation 822 of noise before the noise removal described above, σ(β)=σ(α)$\sqrt{k}$ is obtained. In Step S804, the filter width 823 used for the noise removal of the wide field image 812 is determined according to the ratio of the dose amount 821.

Here, from a relationship of the filter width 823 and the noise removal effect 824 described above, when the dose amount β of the wide field image 812 is 1/k times the dose amount α of the narrow field image 811, the standard deviations of noise can be equalized by setting the filter width 823 of the moving average filter to the wide field image 812 to $\sqrt{k}$ times that of the narrow field image 811. As shown in a column of the filter width 823 of Table 810 of FIG. 8B, both standard deviations 825 of noise after the noise removal of both images become σ(α)/s by setting the filter width 823 related to the wide field image 812 as s$\sqrt{k}$. Incidentally, the same processing can be done for other noise removal processing. Regarding a certain noise removal parameter, a value of the parameter that makes the noise removal effect 824 become 1/s times about the standard deviation as compared with that before the processing is designated as f(s). What is necessary is just to find this f(s) in advance. In fact, if the parameter value of the narrow field image is set to f(s), the standard deviation of noise of the narrow field image will actually be suppressed to 1/s times. Under these circumstances, if the parameter value of the wide field image is set to f(s$\sqrt{k}$), a standard deviation 824 of noise of the wide field image can be suppressed to 1/s$\sqrt{k}$ times, and the standard deviations of noise in both images can be equalized.

By these procedures, it becomes possible to set the noise removal parameter according to the dose amount at which each image is imaged. Moreover, compared with the case of the second example of Step S755 of FIG. 7B, although there is a possibility that a coincidence degree of the standard deviation of noise may be reduced at a level that has almost no influence on the visibility of the combined image, it becomes possible to set the noise removal parameter value at high speed because there is no loop processing and an operation amount is few.

EXAMPLE 2

A point in which a second example differs from the first example is that in each frame image, each of the narrow field region and the wide field region other than it are imaged with the dose amount adjusted to acquire a frame-integrated image. Moreover, a point in which the second example differs from the first example lies in a point that the narrow field region is set and updated to be larger than the structure by a maximum drift amount that may occur in a next frame image and the next frame image is acquired. Since the scanning electron microscope device used in the second example is the same as the scanning electron microscope device 100 explained using FIG. 1 in the first example, an explanation of a device configuration is omitted. A point in which the second example differs from the first example is explained using FIG. 9 and FIG. 10.

Figure 9:
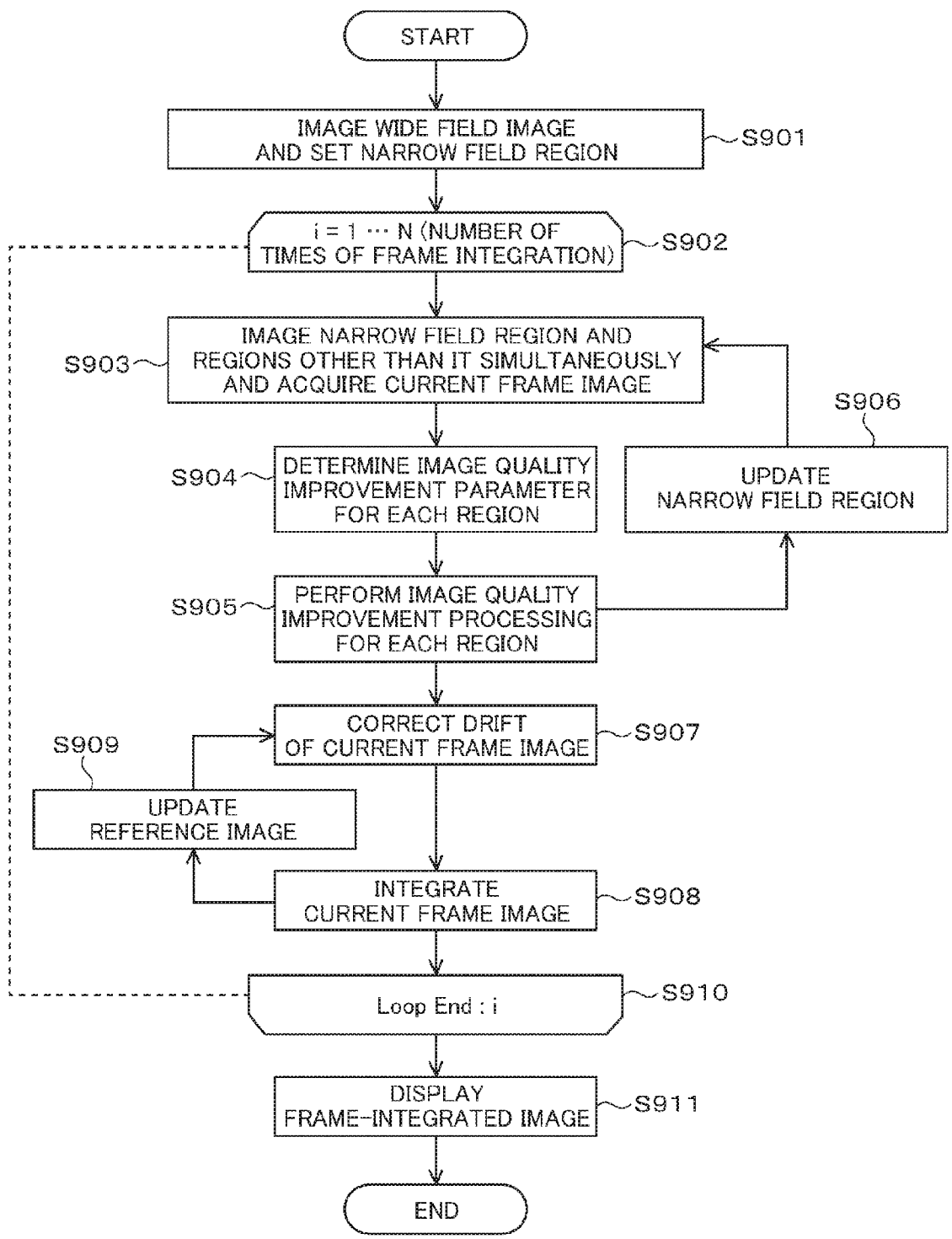
FIG. 9 is a flow diagram showing a flow of processing of creating the combined image by the image quality improvement processing according to a second example of the present invention.

FIG. 9 is a diagram showing a flow of processing of the second example, and is a diagram of one example showing an example in which each frame image is imaged by adjusting the dose amount for each narrow field region and wide field region other than it and the frame-integrated image is acquired.

In Step S901, the wide field image of a small drift amount and with a low S/N ratio is acquired, and the initial region of the narrow field region is set. In Step S902, Steps S903 to S909 are loop processed only by the number of times of frame integration specified by the user. In Step S903, the imaging is performed by adjusting the dose amount for each of the narrow field region and other regions than this to acquire a current frame image. In Step S904, the image quality improvement parameter is determined for each region. In Step S905, the image quality improvement processing is performed for each region. In Step S906, the structure information is judged to the current frame image whose image quality was improved, and the narrow field region is set and updated to be larger than the structure by the maximum drift amount that may occur in the next frame image. In Step S907, the current frame image is drift corrected using the frame-integrated image as the reference image to obtain the current frame image that is drift corrected.

Here, in the frame-integrated image that is acquired by integrating multiple frame images, the image will be blurred if there is the influence of the sample drift between frames etc. For this reason, the drift correction of correcting the dislocation between the frames is necessary. As methods for correcting the dislocation, there is a method whereby matching is performed between the images using a least square error of the brightness values obtained by varying a relative position of the whole image as an index, a position at which the least square error is minimized is calculated, and the dislocation is corrected. In Step S908, the current frame image is integrated to the frame-integrated image. In Step S909, the reference image is updated with the frame-integrated image acquired in Step S908. In Step S910, if the number of times of frame integration is N, loop processing will be ended. Finally, a definitive frame-integrated image is displayed in Step S911.

By these steps, it becomes possible to obtain the frame-integrated image with a sufficient S/N ratio even when the number of times of frame integration is small. Moreover, since the S/N ratio becomes high in the narrow field region in which irradiated dose amount is large, it becomes possible to improve the precision of the drift correction in the narrow field region compared with an image such that the wide field image is simply drift corrected and is frame-integrated.

Figure 10:
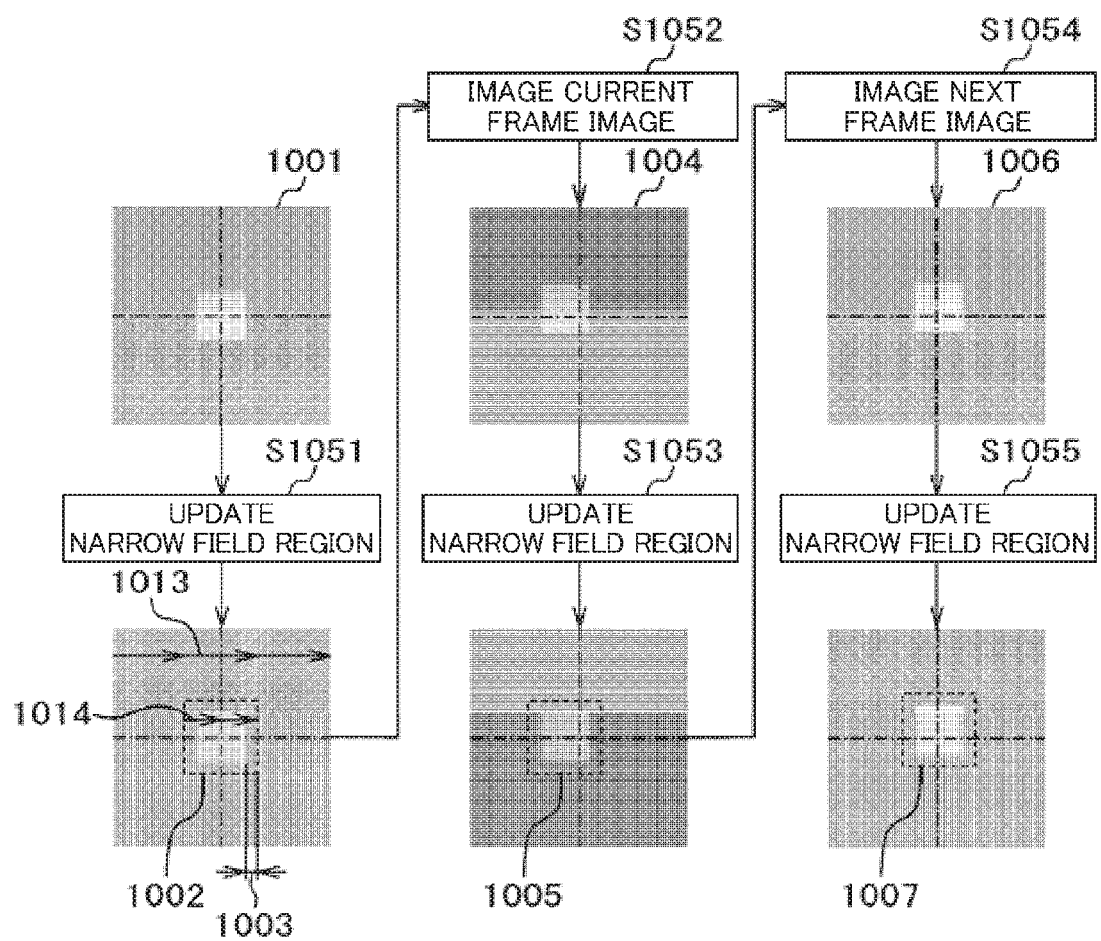
FIG. 10 is a flow diagram showing a flow of processing of updating the narrow field region between the frame images with the structure information and a maximum drift amount considered in the processing of creating the combined image by the image quality improvement processing according to the second example of the present invention.

FIG. 10 is an example in which the narrow field image is updated by adding the structure information and the maximum drift amount between each frame image. In the image of FIG. 10, a central line is drawn so that translation of the structure by the drift may be intelligible. An image 1001 is a preceding frame image and is an image where the structure is located at its center. In Step S1051, the structure information of a preceding frame image is judged, and a narrow field region 1002 is set and updated to be larger than the structure information by a maximum drift amount 1003 that may occur between the frames inputted by the user in advance. In Step S1052, imaging is performed by adjusting the dose amount for each of the narrow field region 1002 and regions other than this and the current frame image 1004 is acquired. Here, the structure in an image 1004 is all contained in the narrow field region 1002. Moreover, when the image 1004 is imaged by irradiating with a uniform dose amount, a scanning speed in regions other than the narrow field region is set to be fast and a scanning speed in the narrow field region is set to be slow, as shown by arrows 1013, 1014, compared with a case where the wide field region is imaged at a constant scanning speed. In Step S1053, the narrow field region is updated to a region 1005 as in the case of Step S1051. Here, in the current frame image, since the structure is drifted from the center of the wide field region to the upper left compared with the preceding frame image, the narrow field region is also translated in parallel according to the drift. The next frame image and subsequent ones are subjected to the following steps sequentially: a next frame image 1006 is acquired in Step S1054; and a narrow field region 1007 is updated in Step S1055.

These steps enable a suitable narrow field region to be set even when the sample translates between frames by the drift. Moreover, to the frame image acquired by irradiating with a uniform dose amount, much dose amount is irradiated in the narrow field region that is the user's region of interest, and it becomes possible to obtain a frame image having many pieces of dominant brightness information.

In the above, although the invention made by the present inventors was concretely explained based on the embodiments, it goes without saying that the present invention is not limited to the embodiments and can be modified variously within a range that does not deviate from its gist. In particular, the present invention is not limited to the wide field region and the effect of the invention is valid also in the imaging of a usual size.

REFERENCE SIGNS LIST

100 Scanning electron microscope device,
101 Scanning electron microscope,
121 Input/output unit,
122 Control unit,
123 Processing unit,
124 Memory unit,
125 Image processing unit,
126 Image region setting unit,
127 Parameter determining unit,
128 Image quality improvement processing unit,
129 Image combining unit.

The invention claimed is:

1. An electron microscope that irradiates a focused electron beam on a sample and acquires an image of the sample, comprising:
a processing unit which sets processing conditions for acquiring the image of the sample;
an image processing unit which processes the image of the sample being acquired;
an input/output unit which inputs the conditions for acquiring the image of the sample and outputs a result that was processed in the image processing unit; and
a control unit which controls the image processing unit and the input/output unit,
wherein the image processing unit comprises
an image region setting unit that sets a wide field region of a relatively wide visual field for acquiring the image of the sample and one or more narrow field regions of a relatively narrow visual field included in the inside of the wide field region, and sets so that dose amounts per pixel of a wide field image and a narrow field image acquired by imaging the wide field image and the narrow field image may become larger in the narrow field image than in the wide field image;
a parameter determining unit that determines a parameter of image quality improvement processing of the wide field region and the narrow field region according to a dose amount per pixel of each region;
an image quality improvement processing unit that performs the image quality improvement processing of the wide field image and the narrow field image based on the parameter determined in the parameter determining unit; and
an image combining unit that combines an image by performing the image quality improvement processing in the image quality improvement processing unit.

2. The electron microscope device according to claim 1, wherein the image region setting unit sets the wide field region or the narrow field region based on one or more pieces of information among a user's input and structure information judged from a change of a brightness value in the narrow field image or the wide field image acquired with the electron microscope.

3. The electron microscope device according to claim 1, wherein the processing unit sets imaging conditions related to the dose amount, a magnification, and a scanning method in the wide field region and the narrow field region that were set by the image region setting unit based on one or more pieces of information among a user's input and structure information as processing conditions for acquiring the image of the sample.

4. The electron microscope device according to claim 2, wherein the image region setting unit judges the structure information in the image from a brightness change in the narrow field image or the wide field image whose image quality was improved by the image quality improvement processing unit.

5. The electron microscope device according to claim 1, wherein the parameter determining unit sets a parameter of the image quality improvement processing in each region of the combined image based on intensity of noise removal.

6. The electron microscope device according to claim 1, wherein the image combining unit corrects drift of one or more of the narrow field images using one or more pieces of information among the wide field image, structure information, and an image in process of combination of the narrow field image and the wide field image.

7. The electron microscope device according to claim 1, wherein the parameter determining unit determines the parameter so that degrees of intensity in all the regions of the combined image of the wide field image and one or more of the narrow field images may be equalized.

8. An imaging method using an electron microscope device that irradiates a focused electron beam on a sample and acquires an image of the sample, comprising the steps of:
setting initial conditions for acquiring the image of the sample by an input/output unit;
setting by a processing unit a wide field region of the sample and one or more narrow field regions that are relatively narrow included in the inside of the wide field region based on the initial conditions set by the input/output unit;
setting an image processing unit so that a dose amount per pixel of the wide field image and the narrow field image obtained by imaging, with the electron microscope device, the wide field region and the narrow field region may become larger in the narrow field image than in the wide field region;
determining, in the image processing unit, image quality improvement parameters of the images of the wide field region and the narrow field region acquired by the imaging according to the dose amount per pixel of each region;
performing image quality improvement processing on the images of the wide field region and the narrow field region using the determined image quality improvement parameters by the image processing unit; and
combining, in the image processing unit, the images of the wide field region and the narrow field region on which the image quality improvement processing was performed by the image processing unit.

9. The imaging method using an electron microscope device according to claim 8,
wherein the wide field region or the narrow field region is set by the processing unit based on one or more pieces of information among a user's input and structure information judged from a change of a brightness value in the narrow field image or the wide field image acquired with an electron microscope.

10. The imaging method using an electron microscope device according to claim 8,
wherein imaging conditions related to the dose amount, a magnification, and a scanning method in the wide field region and the narrow field region being set are set by the image processing unit based on one or more pieces of information among a user's input and structure information as processing conditions for acquiring the image of the sample.

11. The imaging method using an electron microscope device according to claim 9,
wherein the structure information in the image is judged from a brightness change in the narrow field image or the wide field image whose image quality was improved by the image processing unit.

12. The imaging method using an electron microscope device according to claim 8,
wherein the parameter of the image quality improvement processing in each region of the combined image is set by the image processing unit based on intensity of noise removal.

13. The imaging method using an electron microscope device according to claim 8,
wherein in a process of combining the wide field image and the narrow field image by the image processing unit, one or more of the narrow field images are drift corrected using one or more pieces of information among the wide field image, structure information, and an image in process of combination of the wide field image and the narrow field image.

14. The imaging method using an electron microscope device according to claim 8,
wherein the image quality improvement parameter is determined by the mage processing unit so that degrees of noise in all the regions of the combined image of the wide field image and one or more narrow field images may become comparable.

15. The imaging method using an electron microscope device according to claim 8, comprising the steps of:
acquiring, by an electron microscope a frame image comprising the wide field image and the narrow field image included in the wide field image of the sample by irradiating a focused electron beam onto the wide field region and narrow field regions included in the wide field region with a relatively high dose amount in the narrow field region and with a relatively low dose amount in the wide field region other than the narrow field regions;
performing the image quality improvement processing on the acquired frame image by the image processing unit; and
performing frame addition of a plurality of frame images on which the image quality improvement processing was performed by the image processing unit after drift correcting the images.

16. The imaging method using an electron microscope device according to claim 15,
wherein in acquiring a plurality of frame images, setting of the narrow field region is changed by the processing unit according to structure information.

* * * * *